(12) United States Patent
Heigl et al.

(10) Patent No.: US 6,940,273 B2
(45) Date of Patent: Sep. 6, 2005

(54) HANDLING DEVICE, ESPECIALLY FOR POSITIONING A TEST HEAD ON A TESTING DEVICE

(75) Inventors: Helmuth Heigl, Kolbermoor (DE); Hubertus Heigl, Kolbermoor (DE)

(73) Assignee: Cornelia Heigl, Kolbermoor (DE)

( * ) Notice: Subject to any disclaimer, the term of this patent is extended or adjusted under 35 U.S.C. 154(b) by 0 days.

(21) Appl. No.: 10/482,001

(22) PCT Filed: Jul. 4, 2002

(86) PCT No.: PCT/EP02/07444

§ 371 (c)(1),
(2), (4) Date: Jun. 9, 2004

(87) PCT Pub. No.: WO03/005045

PCT Pub. Date: Jan. 16, 2003

(65) Prior Publication Data

US 2004/0245982 A1 Dec. 9, 2004

(30) Foreign Application Priority Data

Jul. 5, 2001 (DE) .......................... 101 32 489

(51) Int. Cl.⁷ .......................... G01R 31/02; G01R 31/28
(52) U.S. Cl. .................................. 324/158.1; 324/765
(58) Field of Search ............................. 324/158.1, 754, 324/758, 765; 269/71; 248/297.11; 414/590

(56) References Cited

U.S. PATENT DOCUMENTS

| | | | |
|---|---|---|---|
| 4,742,980 A | 5/1988 | Heigl | 248/125.9 |
| 5,149,029 A | 9/1992 | Smith | 414/590 |
| 5,606,262 A | 2/1997 | Montalbano et al. | 324/758 |
| 5,949,002 A | 9/1999 | Alden | 73/866.5 |
| 6,023,173 A * | 2/2000 | Khater et al. | 324/758 |
| 6,133,726 A | 10/2000 | Heigl | 324/158.1 |

FOREIGN PATENT DOCUMENTS

| | | |
|---|---|---|
| DE | 3524348 | 1/1987 |
| DE | 3878364 T2 | 3/1989 |
| DE | 4007011 | 9/1991 |
| DE | 19718398 | 11/1998 |
| EP | 0237698 | 9/1987 |
| EP | 0308348 | 3/1989 |
| EP | 0993918 | 4/2000 |
| WO | 9932256 | 7/1999 |
| WO | 0041536 | 7/2000 |
| WO | 0104644 | 1/2001 |

* cited by examiner

*Primary Examiner*—Ernest Karlsen
(74) *Attorney, Agent, or Firm*—Stevens, Davis, Miller & Mosher, LLP

(57) ABSTRACT

Disclosed is a handling device, especially for positioning a test head on a testing device, including a holder for a test head and a column. Positioning apparatus adjustable in a vertical direction is connected to the test head on the column. The handling device advantageously has a simple and compact structure and an exactly reproducible, smooth movement of the test head, because the positioning apparatus has at least one pair of interspaced articulated arms in which one end thereof is respectively articulated on the holder and the other end thereof is articulated on a carriage which can be displaced in a horizontal direction. The articulated arms can be pivotably arranged around a vertical axis. The carriages can move independently from each other.

25 Claims, 7 Drawing Sheets

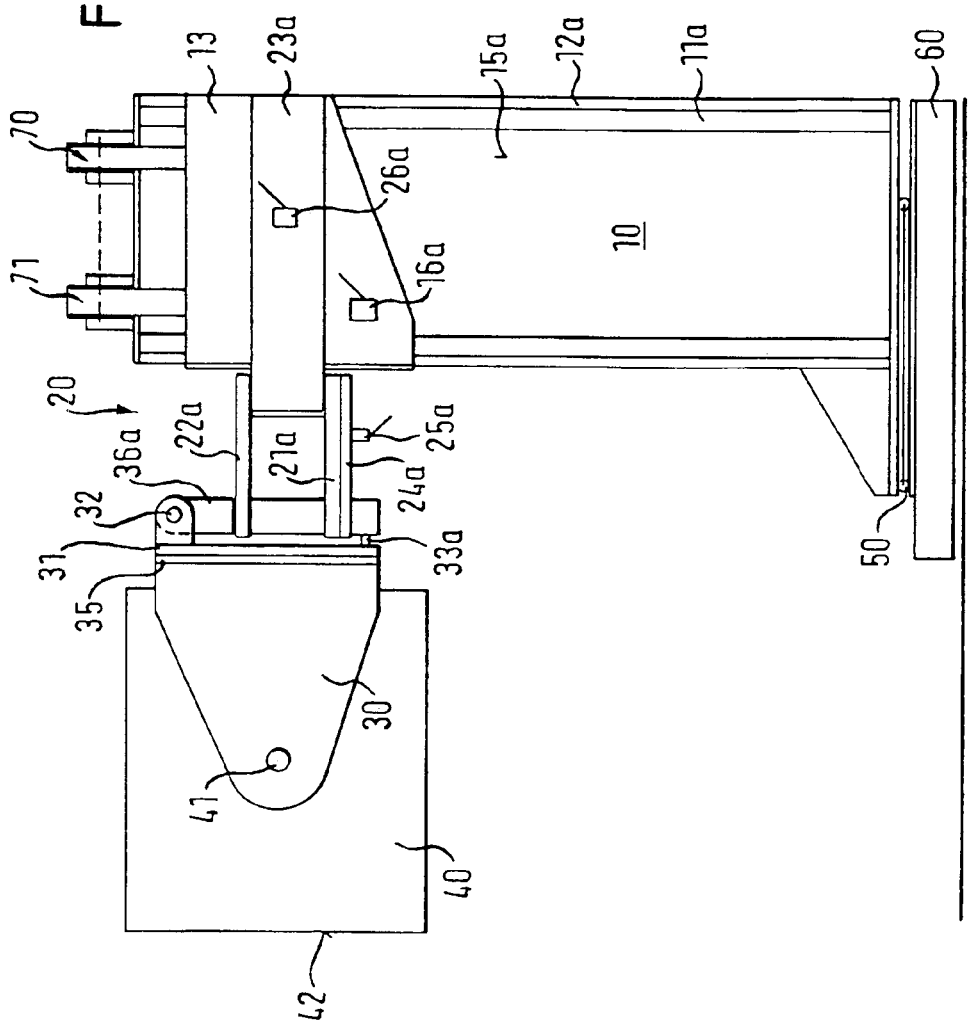

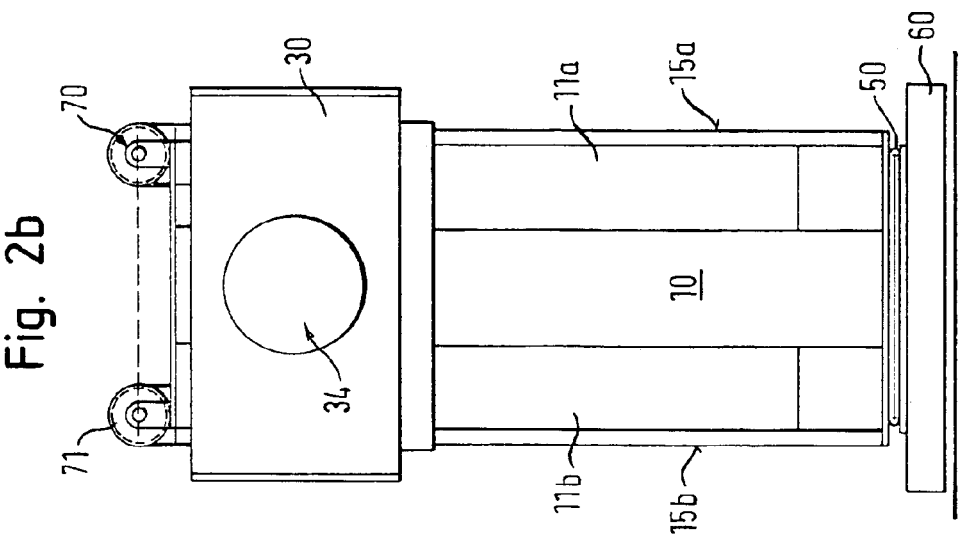
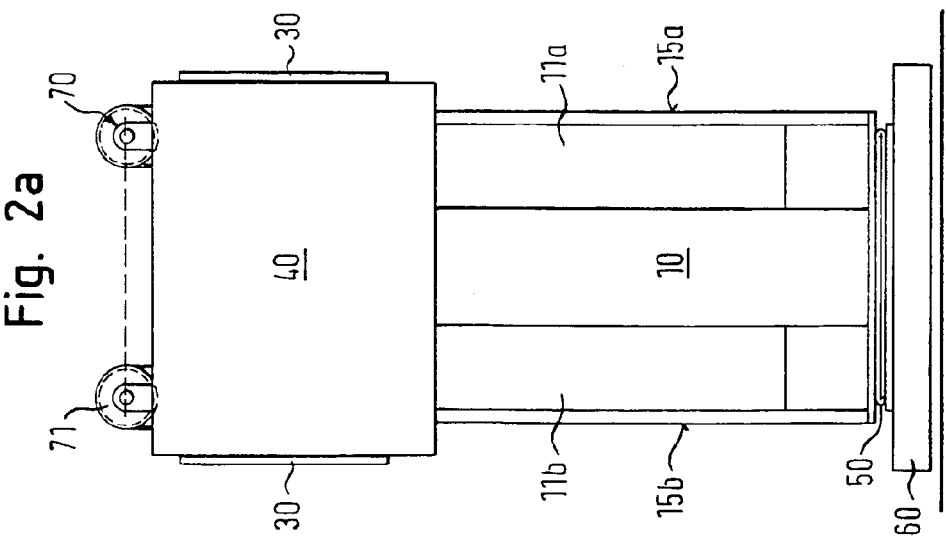

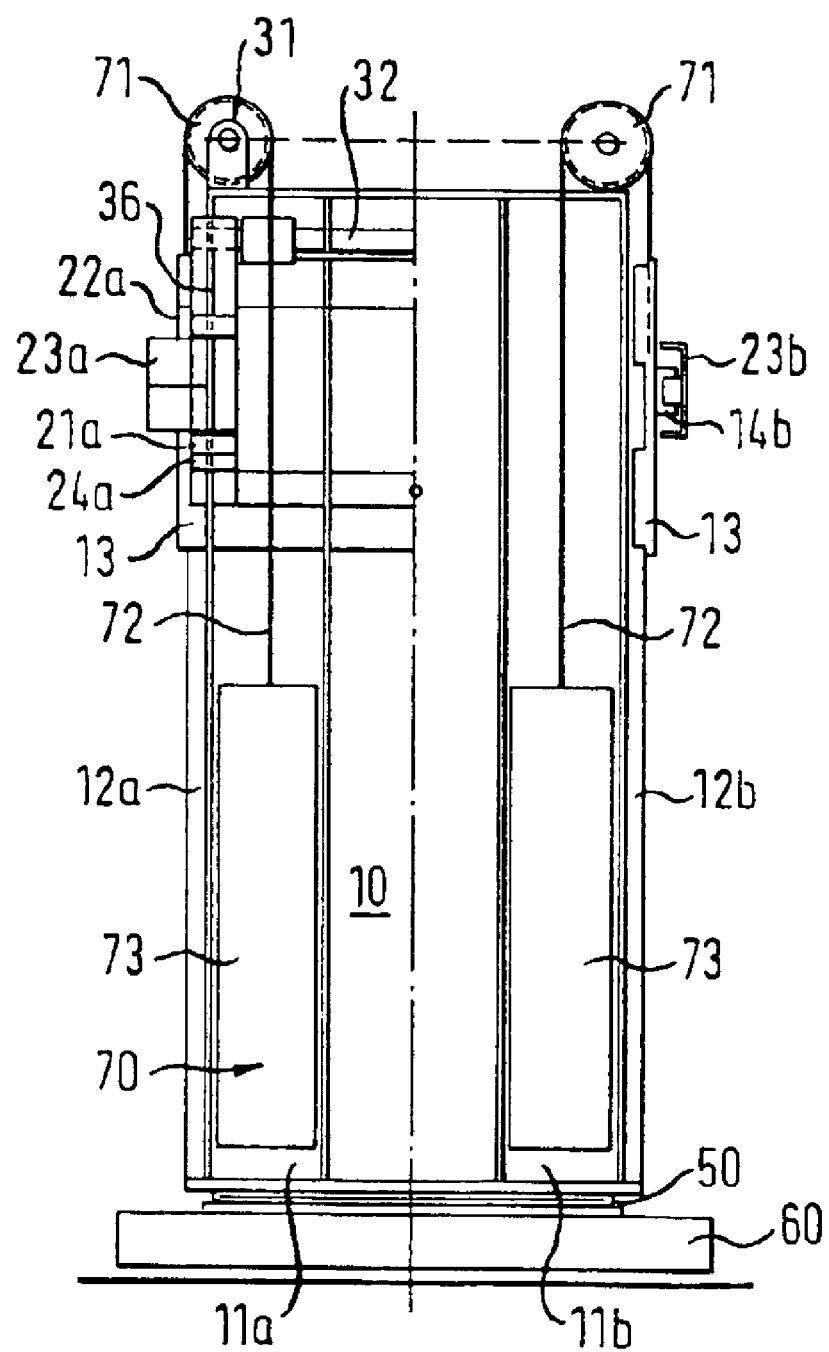

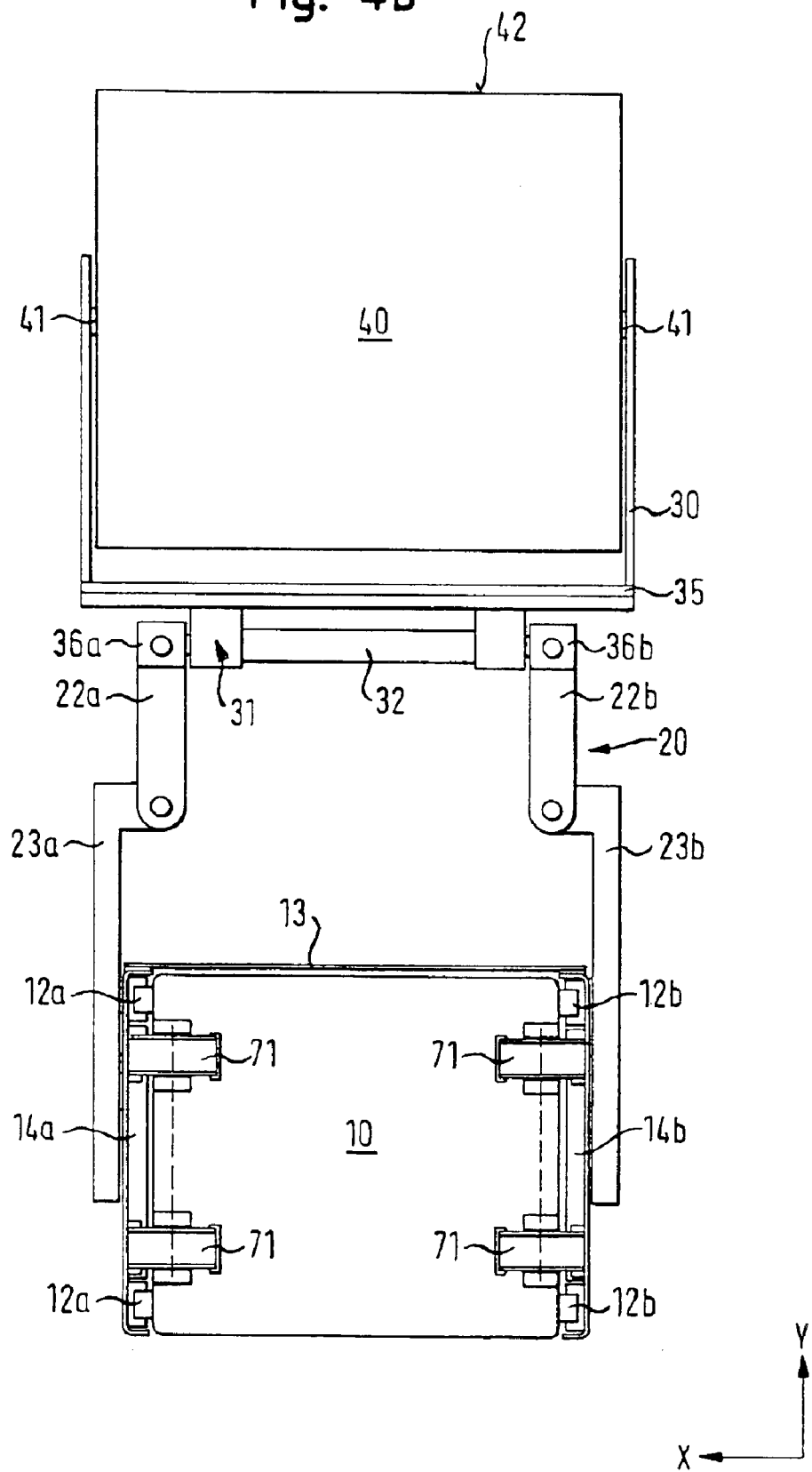

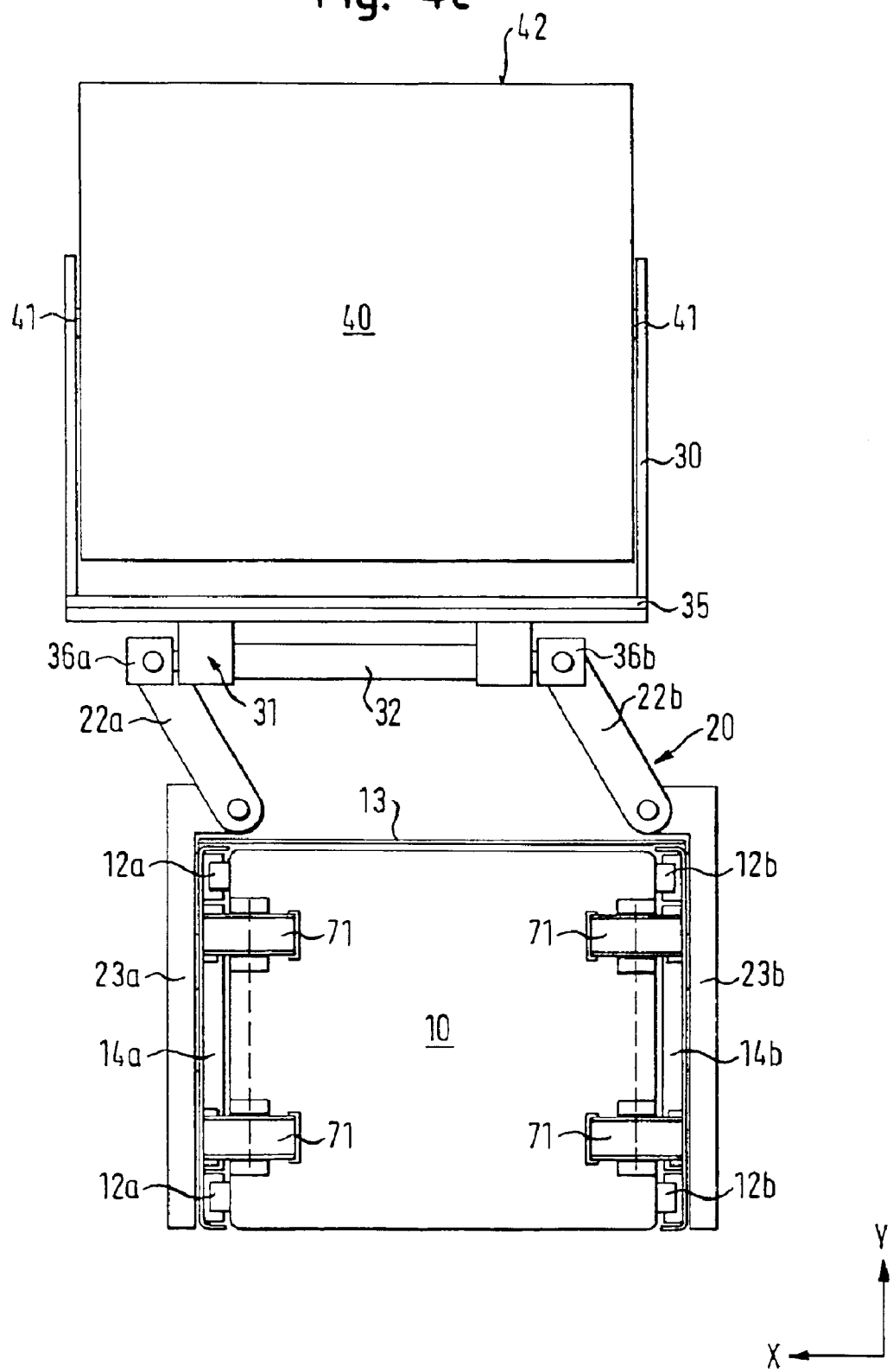

HANDLING DEVICE, ESPECIALLY FOR POSITIONING A TEST HEAD ON A TESTING DEVICE

FIELD OF THE INVENTION

The present invention relates to a manipulator, particularly for positioning a test head on a device handler, comprising a holder for a test head and including a column on which the positioning means connected to the holder are arranged vertically positionable.

BACKGROUND OF THE INVENTION

One such manipulator serves to exactly position a test head relative to the device handler with which, for example, electronic devices, for instance ICs or wafers are furnished so that proper functioning of the devices can be tested by the test head. To obtain a true result, the relatively heavy test head needs to be advanced as near as possible to the device handler to ensure precise docking. This requires precise and smooth positioning of the manipulator positioning the test head three dimensionally. In addition, a compact design of the manipulator is called for since handlers for IC or wafer devices generally find application in a clean or ultraclean room environment requiring an economic footprint.

A manipulator of the aforementioned kind is described in German Patent DE 40 07 011 A1. This known manipulator comprises a vertical guide column on which a positioning means is arranged height-adjustable. The positioning means comprises an extension arm for pivoting in the horizontal plane and mounting a pair of dual articulated arms. At their end facing away from the extension arm the dual articulated arms are connected to a holder serving to secure a test head.

A generic manipulator is furthermore disclosed by the German Patent DE 35 24 348 A1. On this manipulator a pair of dual articulated arms is connected at one end to a test head and[]at the other end to a height-adjusting lead screw.
The dual articulated arms can be locked in position by clamping screws.

Although the dual articulated arm configuration on the known manipulators permits both linear displacement and pivoting of the test head in the horizontal plane, there is the disadvantage that the motion of the dual articulated arms cannot be repeated with the necessary accuracy when translational motion is combined with rotational motion. The fact that the manipulator known from German Patent DE 40 07 011 A1 comprises an extension arm permitting rotational motion in the horizontal plane also fails to change this situation. For, the rotational motion alone fails to make it possible to displace the test head sideways, for example.

SUMMARY OF THE INVENTION

The invention is based on the object of sophisticating a manipulator of the aforementioned kind such that motion of the test head in the horizontal plane is now achievable precisely and smoothly repeatable by a simple design with an economic footprint.

To achieve this object it is provided for on a manipulator having the aforementioned features as it reads from claim 1 that the positioning means comprise at least one pair of articulated arms spaced away from each other, each hinged at their one end to the holder and at their other end to a horizontally travelling carriage, the articulated arms being pivotable about a vertical axis and each carriage being movable independently of the other on the column.

A manipulator having such a configuration exploits having discovered that precise repeatability of the movement of the test head is attained when a pair of articulated arms pivotable in the horizontal plane is coupled to horizontally travelling carriages. This results in any movement of the test head being split into translational motion of the carriages and rotational motion of the articulated arms. Assigning each kind of motion to different positioning members, namely the articulated arms, on the one hand, and the carriages, on the other, assures replication in motion of the test head. Unlike prior art, this now makes it possible to arrange a locking means for docking the test head to a device handler on the holder. For, now, having to adjust the test head relative to the holder as needed in known manipulators, is eliminated due to precise replication in positioning the test head.

The horizontally travelling carriages additionally permit smooth positioning of the test head. Since each carriage can be moved independently of the other, the translational motion of the carriages and the pivoting motion of the articulated arms can now be combined into a rotational motion of the holder and thus of the test head in the horizontal plane in thus ensuring space-saving rotation of the test head.

Advantageous aspects of the manipulator in accordance with the invention form the subject matter of the sub-claims.

Thus, it is a favorable design aspect for the column to comprise linear guides extending vertically for linear translation of a slave actuator provided with guides for the carriages. The linear guides configured like known flat or dovetail guides permit precise positioning of the slave actuator and thus of the holder for the test head vertically. By the slave actuator mounting guides configured, for example, likewise as flat or dovetail guides, vertically positioning the carriages in synchronism is assured.

It is of advantage when the slave actuator and/or the carriages and/or the articulated arms can each be locked in position to permit positioning the holder and thus the test head in sequence three-dimensionally. Locking depends on the way in which the individual actuators are activated, for example, electrically or manually. Thus it is particularly expedient for manual actuation to provide arresting levers by means of which the slave actuator, the carriages and/or the articulated arms can each be positively locked in position.

It is furthermore of advantage when the holder comprises a mount for hinge-mounting the articulated arms. Such a configuration offers the advantage of. facilitating interchanging the holder in thus enabling a variety of test heads to be secured to the manipulator without involving complicated retrofitting.

Preferably the holder is pivotable about a horizontal transverse axis on the mount to result in an additional degree of freedom for moving the test head. This is particularly condusive in conjunction with a relatively heavy weight test head. In this case, the bending of the articulated arms caused by the heavy weight loading can be compensated by a corresponding inclination of the holder relative to the mount. Precisely setting the inclination between holder and mount is assured when in a further aspect of the present invention the holder is supported by an adjustable spacer on the mount.

The number of possibilities of freely moving the test head three-dimensionally is enhanced when to advantage the holder is arranged to rotate about its longitudinal centerline on the mount. Designing this is particularly simple by interposing a pivot bearing between holder and mount. To lead away the cable assembly as usually provided on a test head so that it is not damaged by kinking, experience has shown it to be particularly of advantage to provide the holder and mount with a through-passage which in addition contributes to a compact configuration in passing the cable assembly centrally through the holder.

In accordance with another particularly advantageous further embodiment of the manipulator in accordance with the invention the column comprises two upright posts spaced away from each other, each mounting at least one linear guide, the slave actuator clasping two opposing outer faces of the upright posts. Comprising the column as two upright posts makes it possible to route the cable assembly of the test head between the upright posts safe from being kinked. In addition, this enables a comparatively small spacing between holder and column to be achieved, resulting in not only a compact, but also a rugged configuration for handling the usually relatively very heavy test head. By providing each of the two upright posts with linear guides for the slave actuator, the flow of the forces is evenly divided by the two upright posts. Apart from this, providing for the slave actuator clasping two opposing outer faces of the upright posts ensures up and down travel in synchronism of the slave actuator along the two upright posts.

Preferably, the column is secured to a rotational plate to attain an additional vertical rotational motion. Such a rotational motion is required especially when the test head needs to be positioned between several device handlers or parked in a position for servicing. As an alternative or in addition thereto, the column may also be guided on rails to expedite travelling the manipulator between two positions.

In conclusion, in yet another advantageous further embodiment of the manipulator in accordance with the invention a counterweight assembly may be provided, comprising a counterweight connected to the slave actuator via a traction and pulley system, preferably comprising a cable, belt or chain. Such a counterweight assembly relieves the load on the articulated arms and carriages by the weight of the test head in thus contributing towards smooth, precise positioning of the test head three-dimensionally.

BRIEF DESCRIPTION OF THE DRAWINGS

Further advantages of the present invention will now be detailed by the description of a preferred example embodiment with reference to the drawings showing the example embodiment mainly diagrammatically in which:

FIG. 1 is a side view of a manipulator including a test head;

FIG. 2a is a front view of the manipulator as shown in FIG. 1;

FIG. 2b is a front view as shown in FIG. 2a, but with the test head removed;

FIG. 3 is a split rear view of the manipulator as shown in FIG. 1;

FIG. 4b is a plan view as shown in FIG. 4a, showing the positioning means in a second position;

FIG. 4c is a plan view as shown in FIG. 4a, showing the positioning means in a third position;

DETAILED DESCRIPTION OF THE PREFERRED EMBODIMENT

Figure 4A:
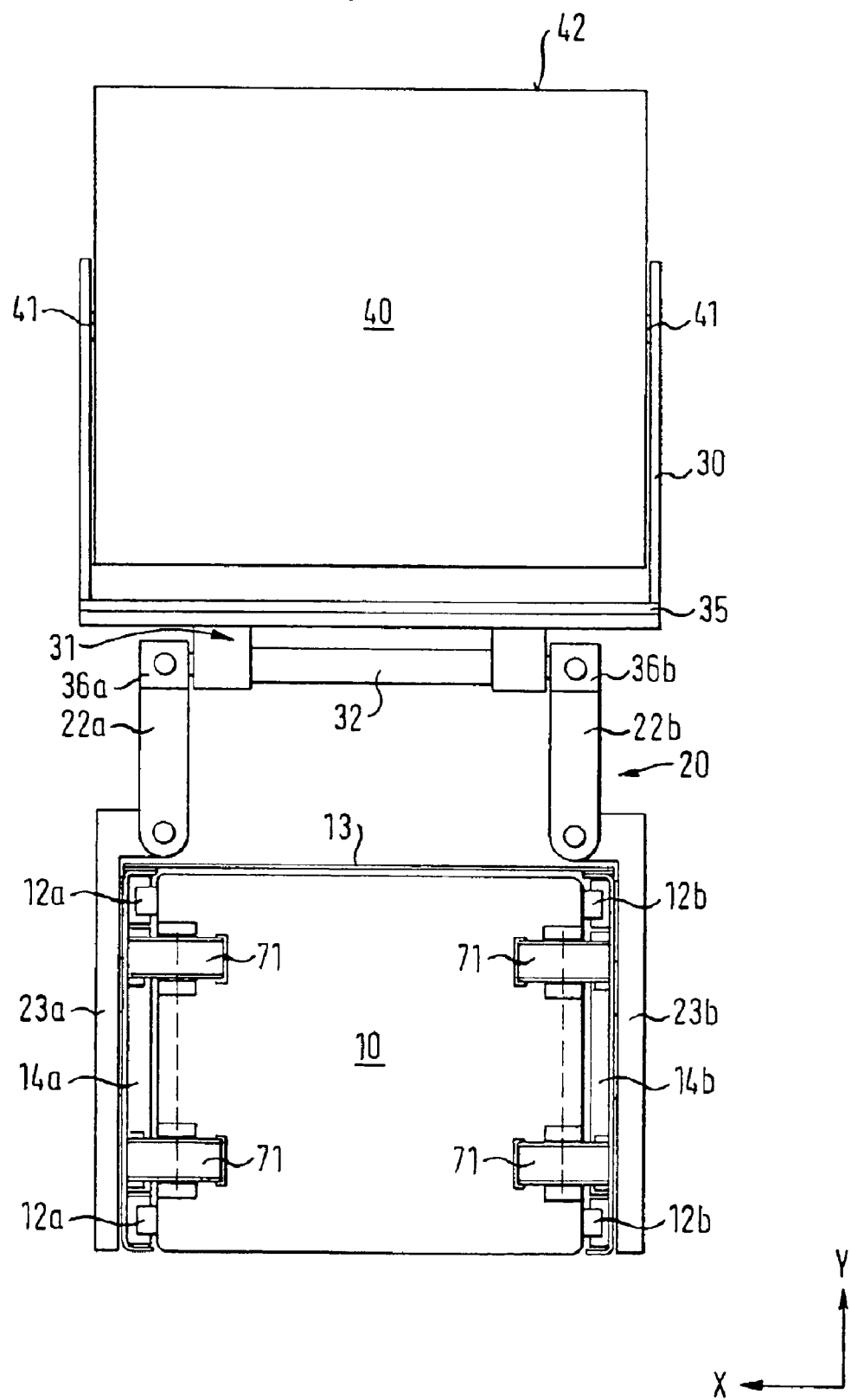
FIG. 4a is a plan view of the manipulator as shown in FIG. 1, showing the positioning means in a first position.

The manipulator as shown in FIGS. 1 to 3 serves to position a test head 40 on a device handler (not shown) for example for ICs or wafers. For this purpose, the manipulator comprises a column 10 composed of two upright posts 11a and 11b spaced away from each other. The column 10 is arranged on a rotational plate 50 which is secured to a bedplate 60. By means of the rotational plate 50 the column 10 is rotatable about its vertical axis. Depending on the particular application, the rotational plate 50 may also be additionally guided on rails secured to the bedplate 60 to ensure maximum possible positioning of the column 10 in its entirety.

Arranged on each upright post 11a, 11b of the column 10 is a linear guide 12a, 12b respectively by means of which a slave actuator 13 clasping two opposing outer faces 15a, 15b of the upright posts 11a, 11b can be travelled along the column 10 vertically. In this arrangement, the slave actuator 13 may be powered manually, hydraulically and/or pneumatically or electrically. In the latter case, the linear guides 12a, 12b are expediently components of a linear motor. By means of an arresting lever 16a the slave actuator 13 can be locked in each position.

Referring now to FIG. 1 there is illustrated in particular how positioning means 20 are arranged on the slave actuator 13 for travelling in the horizontal plane. The positioning means 20 comprise articulated arms 21a, 22a, 22b disposed in pairs one above the other. Each of the articulated arms 21a, 22a, 22b is hinged at one end to a mount 31 and connected by its other end to the carriages 23a, 23b. Assigned to the carriages 23a, 23b are guides 14a, 14b by means of which the carriages 23a, 23b can be travelled horizontally. The guides 14a, 14b configured as linear guides are arranged on the slave actuator 13 for travelling each independently of the other. The carriages 23a, 23b may be powered by known ways and means manually, pneumatically and/or hydraulically or electrically. When powered electrically the guides 14a, 14b and the carriages 23a, 23b are expediently components of a linear motor. In this case it is good practice in a kinematic inverse assembly to arrange the carriages 23a, 23b on the slave actuator 13 and to connect the articulated arms 21a, 22a, 22b to the ends of the guides 14a, 14b. Each of the carriages 23a, 23b can be locked in position by an arresting lever 26a.

Each of the articulated arms 21a, 22a, 22b arranged pivotable about a vertical axis on the carriages 23a, 23b and the mount 31 can be likewise locked in position. For this purpose at least one clamping plate 24a is provided on which an arresting lever 25a preferably configured as an eccentric gear is arranged and which locates the articulated arms 21a, 22a, 22b positively connected.

At its upper end the mount 31 comprises a horizontally extending transverse axis 32 on which pivot arms 36a, 36b connected to the articulated arms 21a, 22a, 22b are hinged. Arranged at each lower end of the pivot arms 36a, 36b is an adjustable spacer 33a for precisely setting the inclination of the pivot arms 36a, 36b relative to a holder 30 secured to the mount 31 for the test head 40.

The holder 30 is arranged by means of pivot bearing 35 on the side of the mount 31 opposite the pivot arms 36a, 36b. The pivot bearing 35 permits rotation of the substantially bifurcated holder 30 about its longitudinal centerline extending in the y direction. In addition, the test head 40 is arranged on the holder 30 for pivoting about an axis of rotation 41 extending horizontally in the y direction so that a face 42 of the test head 40 is able to assume any position three-dimensionally. The holder 30 and the mount 31 are provided with a through-passage 34, as is particularly evident from FIG. 2b. The through-passage 34 serves to receive the cable assembly of the test head 40 for leading it out between the upright posts 11*a*, 11*b*.

Referring now to FIG. 3 there is illustrated in particular how the slave actuator 13 is connected to a counterweight 73 by a belt 72 guided over a pulley 71 at the upper end of the column 10. The counterweight assembly 70 formed in this way serves to compensate the load on the positioning means 20 caused by the, as a rule, relatively heavy weight of the test head 40 by known ways and means. To make for balanced loading, the counterweight 73 is split in two parts, each of which moves within the upright posts 11*a*, 11*b*.

The manipulator as described above is characterized by precise repeatability in smooth motion of the test head 40. The reason for this is the ability to position the slave actuator 13 vertically in the z direction. In addition to this the test head 40 can be reproducibly positioned in the horizontal plane by the articulated arms 21*a*, 22*a*, 22*b* and carriages 23*a*, 23*b*. Referring now to FIGS. 4*a* to 4*d* there are illustrated various positions of the positioning means 20. In FIG. 4*a* the positioning means 20 are in a home position, i.e. the carriages 23*a*, 23*b* are retracted on the slave actuator 13 and the articulated arms 21*a*, 22*a*, 22*b* are parked in a position parallel to the carriages 23*a*, 23*b*. In FIG. 4*b* the positioning means 20 are positioned for linear travel relative to the test head 40, i.e. the position of the articulated arms 21*a*, 22*a*, 22*b* is unchanged but the carriages 23*a*, 23*b* are travelled somewhat further in the y direction.

Referring now to FIG. 4*c* there is illustrated the positioning means 20 positioned so that although the test head 40 is pivoted in both the x direction and y direction, its face 42 always remains oriented parallel to the column 10. To ensure shifting of the test head 40 exclusively in the x direction, the shift in the y direction prompted by pivoting the articulated arms 21*a*, 22*a*, 22*b* can be compensated by a corresponding shift in the movement of the carriages 23*a*, 23*b*.

Figure 4D:
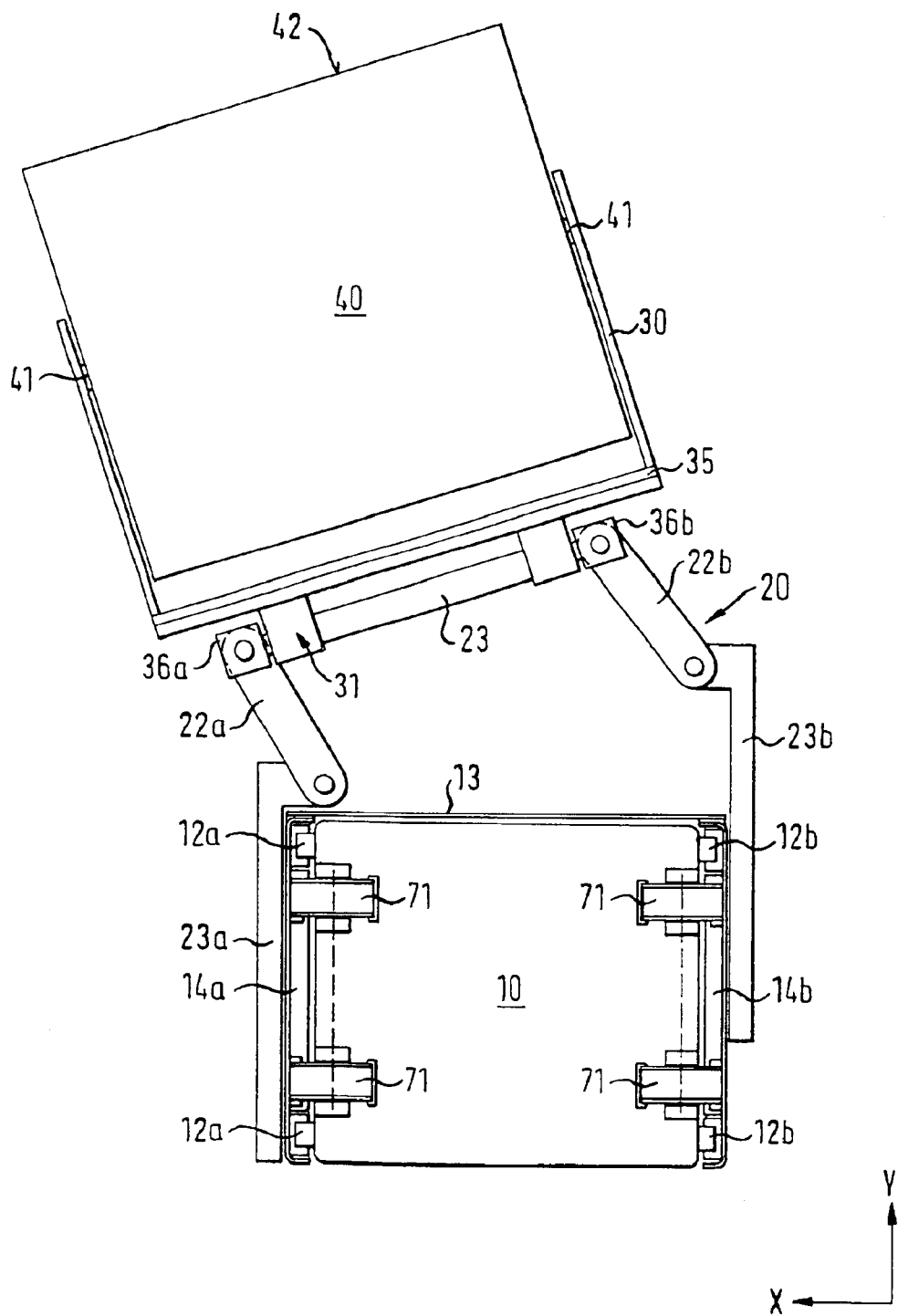
FIG. 4d is a plan view as shown in FIG. 4a, showing the positioning means in a fourth position.

Referring now to FIG. 4*d* there is illustrated another positions of moving the test head 40 by the positioning means 20 showing the carriages 23*a*, 23*b* each positioned independently of the other differingly far from the home position as shown in FIG. 4*a*. It is in this way that the articulated arms 21*a*, 22*a*, 22*b* are pivoted such that the test head 40 is rotated relative to its starting position as shown in FIG. 4*a*. In the position as shown in FIG. 4*d* the face 42 of the test head 40 is oriented inclined to, for instance, the side of the slave actuator 13 opposing the test head 40. Rotation of the test head 40 solely by the positioning means 20 can be combined with rotation of the column 10 by the rotational plate 50 for speedy, convenient movement of the test head 40 into any position three-dimensionally.

The manipulator as described above is characterized in addition by a simple and compact configuration. This is primarily due to splitting the column 10 into two upright posts 11*a*, 11*b* spaced away from each other since this now makes it possible to route the cable assembly of the test head 40 through the through-passage 34 without kinking between the two upright posts 11*a*, 11*b*. The spacing of the upright posts 11*a*, 11*b* from each other is expediently selected as a function of the thickness of the cable assembly. It is in addition useful to arrange the upright posts 11*a*, 11*b* symmetrically on the rotational plate 50 for kinkless cable routing. Furthermore, the pivot arms 36 of the mount 31 permit precise orientation of the holder 30 relative to the positioning means 20 which due to the relatively heavy weight of the test head 40 in general are subjected to quite considerable flexural loading. Last but not least, providing the counterweight assembly 70 makes for comparatively smooth positioning of the positioning means 20.

LIST OF REFERENCE NUMERALS

- 10 column
- 11*a* upright post
- 11*b* upright post
- 12*a* linear guide
- 12*b* linear guide
- 13 slave actuator
- 14*a* guide
- 14*b* guide
- 15*a* outer face
- 15*b* outer face
- 16*a* arresting lever
- 20 positioning means
- 21*a* articulated arm
- 22*a* articulated arm
- 22*b* articulated arm
- 23*a* carriage
- 23*b* carriage
- 24*a* clamping plate
- 25*a* arresting lever
- 26*a* arresting lever
- 30 holder
- 31 mount
- 32 transverse axis
- 33*a* spacer
- 34 through-passage
- 35 pivot bearing
- 36*a* pivot arm
- 36*b* pivot arm
- 40 test head
- 41 axis of rotation
- 42 surface
- 50 rotational plate
- 60 bedplate
- 70 counterweight assembly
- 71 pulley
- 72 belt
- 73 counterweight
- x coordinate
- y coordinate
- z coordinate

What is claimed is:

1. A manipulator for positioning a test head on a device handler, said manipulator comprising:

a holder for a test head;

a positioning means connected to said holder;

a column on which said positioning means is arranged vertically positionable, said column comprising linear guides extending vertically for linear translation of a slave actuator;

said positioning means comprising at least one pair of articulated arms and at least one pair of horizontally traveling carriages;

said articulated arms being spaced away from each other and pivotable about a vertical axis, said articulated arms having a first end and a second end, said first end being hinged to said holder and said second end being hinged to said carriages respectively;

said slave actuator comprising guides for linear translation of said carriages; and said carriages being arranged movable independently of each other on said slave actuator.

2. The manipulator as set forth in claim 1, wherein said slave actuator and/or said carriages and/or said articulated arms are each lockable in position.

3. The manipulator as set forth in claim 1, wherein said holder comprises a mount for hinge-mounting said articulated arms.

4. The manipulator as set forth in claim 3, wherein said holder is pivotable about a horizontal transverse axis on said mount.

5. The manipulator as set forth in claim 4, wherein said holder is supported by an adjustable spacer on said mount.

6. The manipulator as set forth in claim 3, wherein said holder has a longitudinal centerline and is arranged to rotate about said longitudinal centerline on said mount.

7. The manipulator as set forth in claim 3, wherein said holder and said mount are provided with a through-passage.

8. The manipulator as set forth in claim 1, wherein said column comprises two upright posts spaced away from each other, and having two opposing outer faces; said outer faces comprising said linear guides and being clasped by said slave actuator.

9. The manipulator as set forth in claim 1, wherein said column is secured to a rotational plate.

10. The manipulator as set forth in claim 1, wherein said column is guided on rails.

11. The manipulator as set forth in claim 1, further comprising a counterweight assembly, said counterweight assembly comprising a counterweight connected to said slave actuator via a pulley and traction means.

12. The manipulator as set forth in claim 11, wherein said traction means is selected from the group consisting of a cable, belt and chain.

13. A manipulator for positioning a test head on a device handler, said manipulator comprising:
    a holder for a test head;
    a positioning means connected to said holder;
    a column on which said positioning means is arranged vertically positionable, said column comprising linear guides extending vertically for linear translation of a slave actuator;
    said positioning means comprising at least one articulated arm and at least one horizontally traveling carriage;
    said articulated arm being pivotable about a vertical axis, and having a first end and a second end, said first end being hinged to said holder and said second end being hinged to said carriage; and
    said slave actuator comprising guides for linear translation of said carriage.

14. The manipulator as set forth in claim 13, comprising a pair of articulated arms spaced away from each other and a pair of horizontally traveling carriages, wherein each of said carriages is arranged movable independently of each other said carriage on said slave actuator.

15. The manipulator as set forth in claim 13, wherein said slave actuator and/or said carriage and/or said articulated arm are each lockable in position.

16. The manipulator as set fourth in claim 13, wherein said holder comprises a mount for hinge-mounting said articulated arm.

17. The manipulator as set forth in claim 16, wherein said holder is pivotable about a horizontal transverse axis on said mount.

18. The manipulator as set forth in claim 16, wherein said holder is supported by an adjustable spacer on said mount.

19. The manipulator as set forth in claim 16, wherein said holder has a longitudinal centerline and is arranged to rotate about said longitudinal centerline on said mount.

20. The manipulator as set forth in claim 16, wherein said holder and said mount are provided with a through-passage.

21. The manipulator as set forth in claim 13, wherein said column comprises two upright posts spaced away from each other and having two opposing outer faces; said outer faces comprising said linear guides and being clasped by said slave actuator.

22. The manipulator as set forth in claim 13, wherein said column is secured to a rotational plate.

23. The manipulator as set forth in claim 13, wherein said column is guided on rails.

24. The manipulator as set forth in claim 13, wherein a counterweight assembly, said counterweight assembly comprising a counterweight connected to said slave actuator via a pulley and traction means.

25. The manipulator as set forth in claim 24, wherein said traction means is selected from the group consisting of a cable, belt and chain.

* * * * *